(12) United States Patent
Takeuchi

(10) Patent No.: US 7,203,121 B2
(45) Date of Patent: Apr. 10, 2007

(54) SEMICONDUCTOR INTEGRATED CIRCUIT DEVICE AND DATA WRITE METHOD THEREOF

(75) Inventor: Yoshiaki Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 139 days.

(21) Appl. No.: 10/879,297

(22) Filed: Jun. 30, 2004

(65) Prior Publication Data
US 2005/0232067 A1   Oct. 20, 2005

(30) Foreign Application Priority Data
Apr. 16, 2004   (JP) .............................. 2004-121750

(51) Int. Cl.
G11C 8/00   (2006.01)
(52) U.S. Cl. .............................. 365/230.01; 365/189.07
(58) Field of Classification Search ...................... None
See application file for complete search history.

(56) References Cited

U.S. PATENT DOCUMENTS 5,629,896 A * 5/1997 McClure ................ 365/189.05
6,590,829 B2 * 7/2003 Takeuchi .................. 365/233.5
6,834,020 B2 * 12/2004 Takahashi et al. .......... 365/222
2002/0126566 A1 * 9/2002 Takeuchi ................. 365/233.5
2005/0068837 A1 * 3/2005 Takeuch et al. ....... 365/230.01

FOREIGN PATENT DOCUMENTS

JP   2002-269977   9/2002

* cited by examiner

Primary Examiner—Amir Zarabian
Assistant Examiner—Kretelia Graham
(74) Attorney, Agent, or Firm—Oblon, Spivak, McClelland, Maier & Neustadt, P.C.

(57) ABSTRACT

A semiconductor integrated circuit device includes a memory cell array, an address transition detecting circuit which detects transition of a column address signal, the column address signal being used to specify a column address of the memory cell array, a control circuit having a timeout circuit, the control circuit which generates an internal circuit control signal of desired length used to control column access to the memory cell array based on a result of detection by the address transition detecting circuit, and a column selection line whose selection time is controlled by the control circuit, wherein the column address signal used for selection of the column selection line is latched in a period of time in which the column selection line is selected at a write operation time.

18 Claims, 13 Drawing Sheets

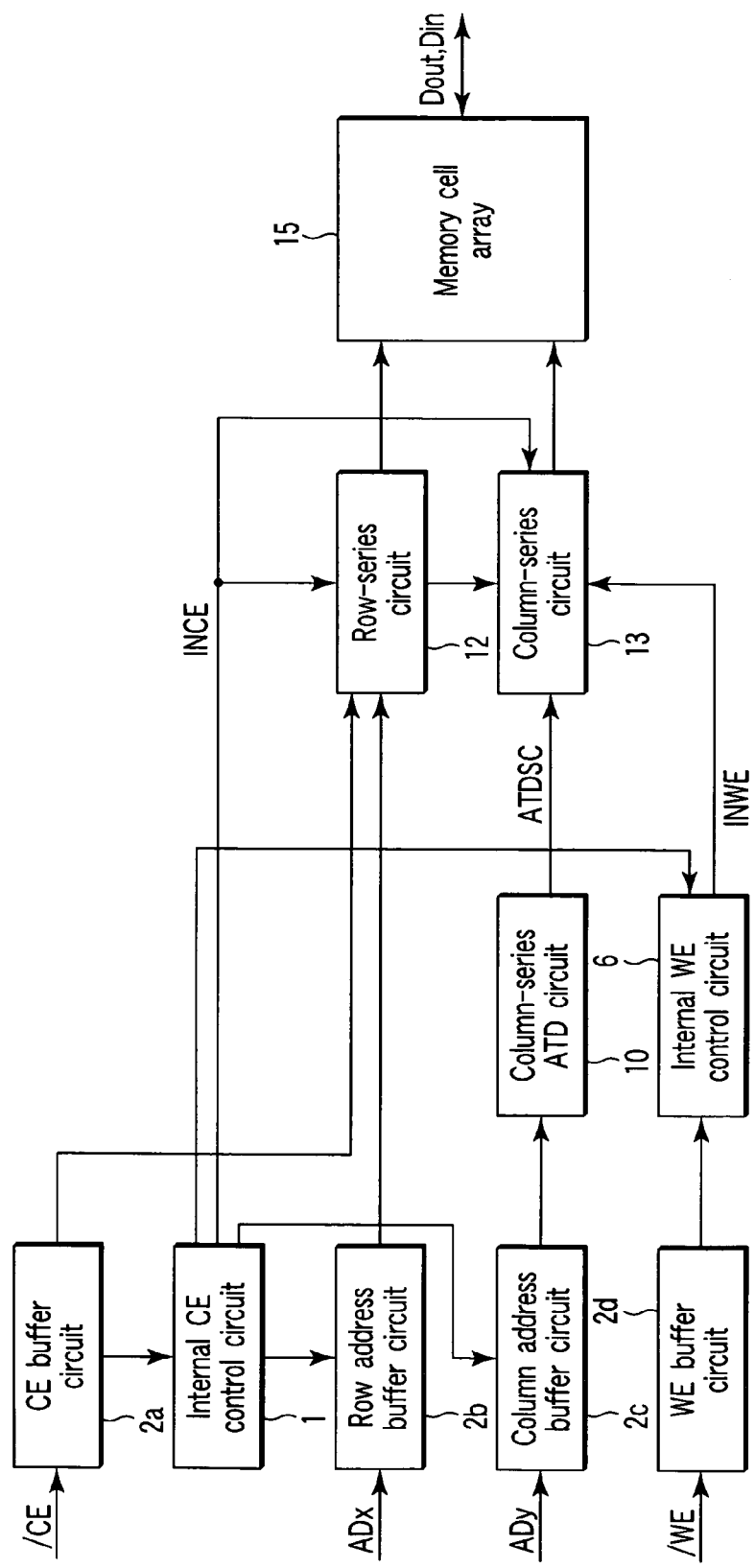
F I G. 1

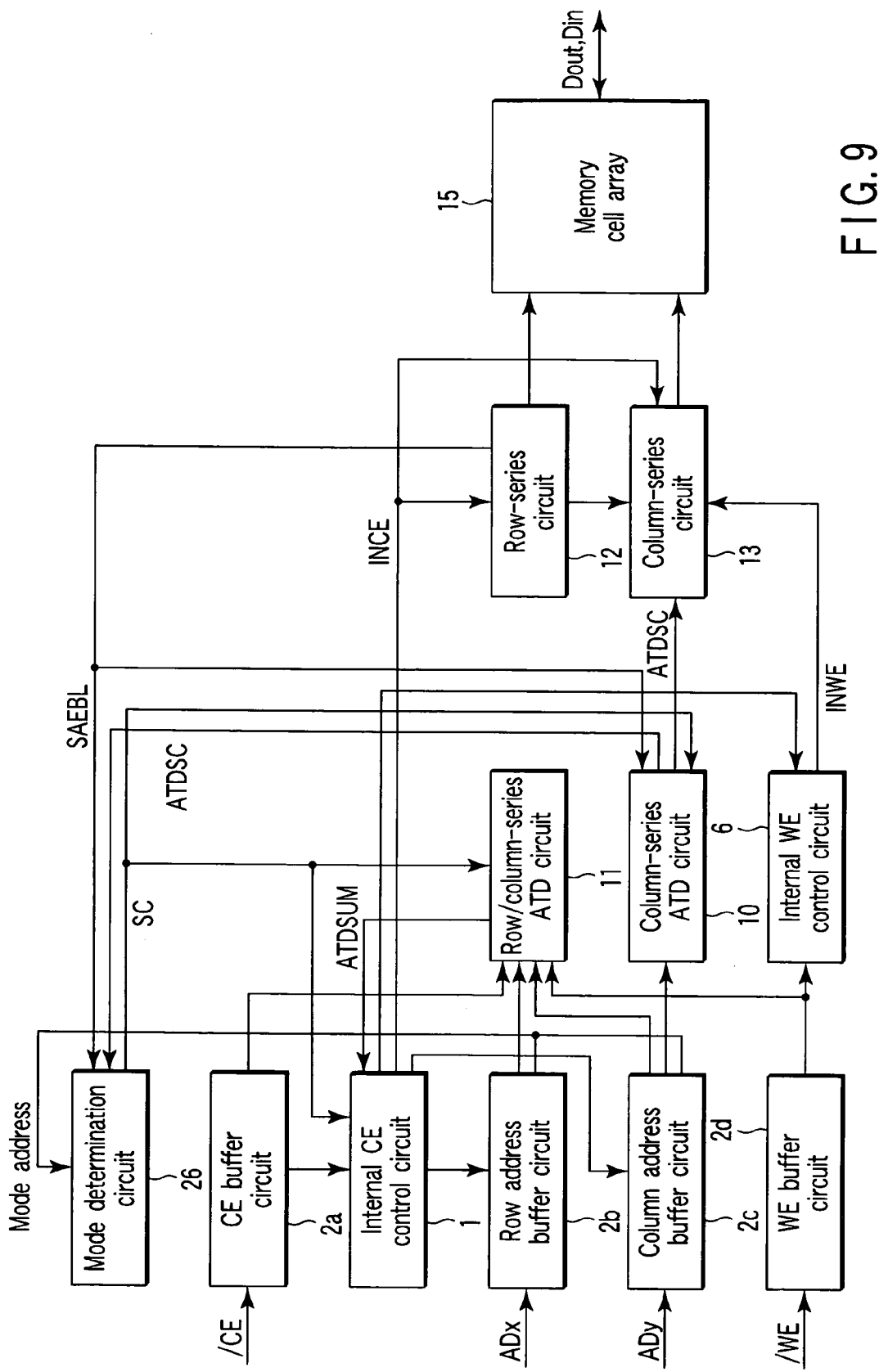
F I G. 9

SEMICONDUCTOR INTEGRATED CIRCUIT DEVICE AND DATA WRITE METHOD THEREOF

CROSS-REFERENCE TO RELATED APPLICATIONS

This application is based upon and claims the benefit of priority from prior Japanese Patent Application No. 2004-121750, filed Apr. 16, 2004, the entire contents of which are incorporated herein by reference.

BACKGROUND OF THE INVENTION

1. Field of the Invention

This invention relates to a semiconductor integrated circuit device and a data write method thereof and more particularly to a semiconductor integrated circuit device using a DRAM (Dynamic Random Access Memory) or FeRAM (Ferro-electric Random Access Memory) in a memory core section.

2. Description of the Related Art

Conventionally, pseudo SRAMs each using a DRAM (Dynamic Random Access Memory) or FeRAM (Ferro-electric Random Access Memory) in a memory core section are commercialized in order to enhance the integration density while the compatibility thereof with existing SRAMs (Static Random Access Memories) in application is maintained.

Among the pseudo SRAMs, a synchronous type SRAM in which an internal circuit is controlled by a clock signal internally and time-serially generated based on an external input signal (for example, external chip enable signal /CE) and an asynchronous type SRAM in which an internal circuit can be operated asynchronously with respect to an external input signal are provided. At present, the synchronous type SRAM is dominant, but expectations for the asynchronous type SRAM gradually rise.

In the synchronous type pseudo SRAM, a high-speed operation mode such as a static column mode in which memory cells of a row selected by a row address are sequentially accessed by use of a column address signal is provided in many cases.

In the static column mode, the address data latching operation is not performed to cope with the asynchronous operation in the read operation. Further, the address latch control operation is performed by use of an external write enable signal /WE in order to prevent destruction of data in the write operation (refer to FIG. 18).

The reason why the address latch control operation at the write operation time is required is as follows. In the read operation, cell data is simply read out even when column selection lines are multi-selected, and therefore, data stored in the cell will not be destroyed by rewriting data which is the same as the read data after the read operation. However, in the write operation, if the column selection lines are multi-selected, there occurs a possibility that erroneous data will be written into a cell and thus correct data stored in the cell will be rewritten.

Therefore, in the synchronous write operation of the static column, the clock operation for the column address signal and external write enable signal /WE is required in order to prevent data destruction and therefore a complete asynchronous operation is not performed.

In the asynchronous type pseudo SRAM, a semiconductor integrated circuit device in which a high-speed operation mode such as a static column mode can be set is disclosed in Jpn. Pat. Appln. KOKAI Publication No. 2002-269977.

However, like the synchronous type pseudo SRAM, since the asynchronous type pseudo SRAM requires the clock operation for the column address signal and external write enable signal /WE in the write operation of the static column mode, a complete asynchronous operation is not performed.

As described above, in the conventional semiconductor integrated circuit device having the synchronous or asynchronous type pseudo SRAM mounted thereon, it is difficult to realize a complete asynchronous operation with respect to an external input signal while data is prevented from being destroyed in the write operation of the high-speed operation mode such as a static column mode.

BRIEF SUMMARY OF THE INVENTION

A semiconductor integrated circuit device according to a first aspect of the present invention comprises a memory cell array, an address transition detecting circuit which detects transition of a column address signal, the column address signal being used to specify a column address of the memory cell array, a control circuit having a timeout circuit, the control circuit which generates an internal circuit control signal of desired length used to control column access to the memory cell array based on a result of detection by the address transition detecting circuit, and a column selection line whose selection time is controlled by the control circuit, wherein the column address signal used for selection of the column selection line is latched in a period of time in which the column selection line is selected at a write operation time.

A semiconductor integrated circuit device according to a second aspect of the present invention comprises a memory cell array, a first address transition detecting circuit which detects at least one of transition of a chip enable signal, transition of a row address signal and a column address signal and transition of a write enable signal, the chip enable signal being used to specify start of the operation of the memory cell array, the row address signal being used to specify a row address of the memory cell array, the column address signal being used to specify a column address of the memory cell array, the write enable signal being used to specify a write operation of the memory cell array, a first control circuit having a timeout circuit, the first control circuit which generates an internal circuit control signal of desired length used to control row access to the memory cell array based on a result of detection by the first address transition detecting circuit, a second address transition detecting circuit which detects only transition of the column address signal, a second control circuit which controls column access to the memory cell array based on a result of detection by the second address transition detecting circuit, a column selection line whose selection time is controlled by the second control circuit, and a mode determination circuit which determines start of a column access mode to generate a mode determination signal and set a column access operation when transition of the column address signal is detected by the second address transition detecting circuit in a case where a condition that the column access operation of the memory cell array can be started is satisfied and then determines an end of the column access mode and sets a standby state in a case where transition of one of the row address and a predetermined address is detected, wherein the column address signal used for selection of the column selection line is latched in a period of time in which the column selection line is selected when the mode determination circuit determines the column access mode at a write operation time.

A data write method of a semiconductor integrated circuit device according to a third aspect of the present invention is a data write method of a semiconductor device which includes a memory cell array, an address transition detecting circuit which detects transition of a column address signal, the column address signal being used to specify a column address of the memory cell array, a control circuit having a timeout circuit, the control circuit which generates an internal circuit control signal of desired length used to control column access to the memory cell array based on a result of detection by the address transition detecting circuit, and a column selection line whose selection time is controlled by the control circuit, comprises latching the column address signal used for selection of the column selection line in a period of time in which the column selection line is selected at a write operation time.

A data write method of a semiconductor integrated circuit device according to a fourth aspect of the present invention is a data write method of a semiconductor device which includes a memory cell array, a first address transition detecting circuit which detects at least one of transition of a chip enable signal, transition of a row address signal and a column address signal and transition of a write enable signal, the chip enable signal being used to specify start of the operation of the memory cell array, the row address signal being used to specify a row address of the memory cell array, the column address signal being used to specify a column address of the memory cell array, the write enable signal being used to specify a write operation of the memory cell array, a first control circuit having a timeout circuit, the first control circuit which generates an internal circuit control signal of desired length used to control row access to the memory cell array based on a result of detection by the first address transition detecting circuit, a second address transition detecting circuit which detects only transition of the column address signal, a second control circuit which controls column access to the memory cell array based on a result of detection by the second address transition detecting circuit, a column selection line whose selection time is controlled by the second control circuit, and a mode determination circuit which determines start of a column access mode to generate a mode determination signal and set a column access operation when transition of the column address signal is detected by the second address transition detecting circuit in a case where a condition that the column access operation of the memory cell array can be started is satisfied and then determines an end of the column access mode and sets a standby state in a case where transition of one of the row address and a predetermined address is detected, comprises latching the column address signal used for selection of the column selection line in a period of time in which the column selection line is selected when the mode determination circuit determines the column access mode at a write operation time.

BRIEF DESCRIPTION OF THE SEVERAL VIEWS OF THE DRAWING

FIG. 1 is a block diagram showing an example of part of the configuration of a pseudo SRAM mounted on a semiconductor integrated circuit device, for illustrating the semiconductor integrated circuit device according to a first embodiment of this invention;

FIG. 9 is a block diagram showing an example of part of the configuration of a pseudo SRAM mounted on a semiconductor integrated circuit device, for illustrating the semiconductor integrated circuit device according to a second embodiment of this invention;

DETAILED DESCRIPTION OF THE INVENTION

Figure 2:
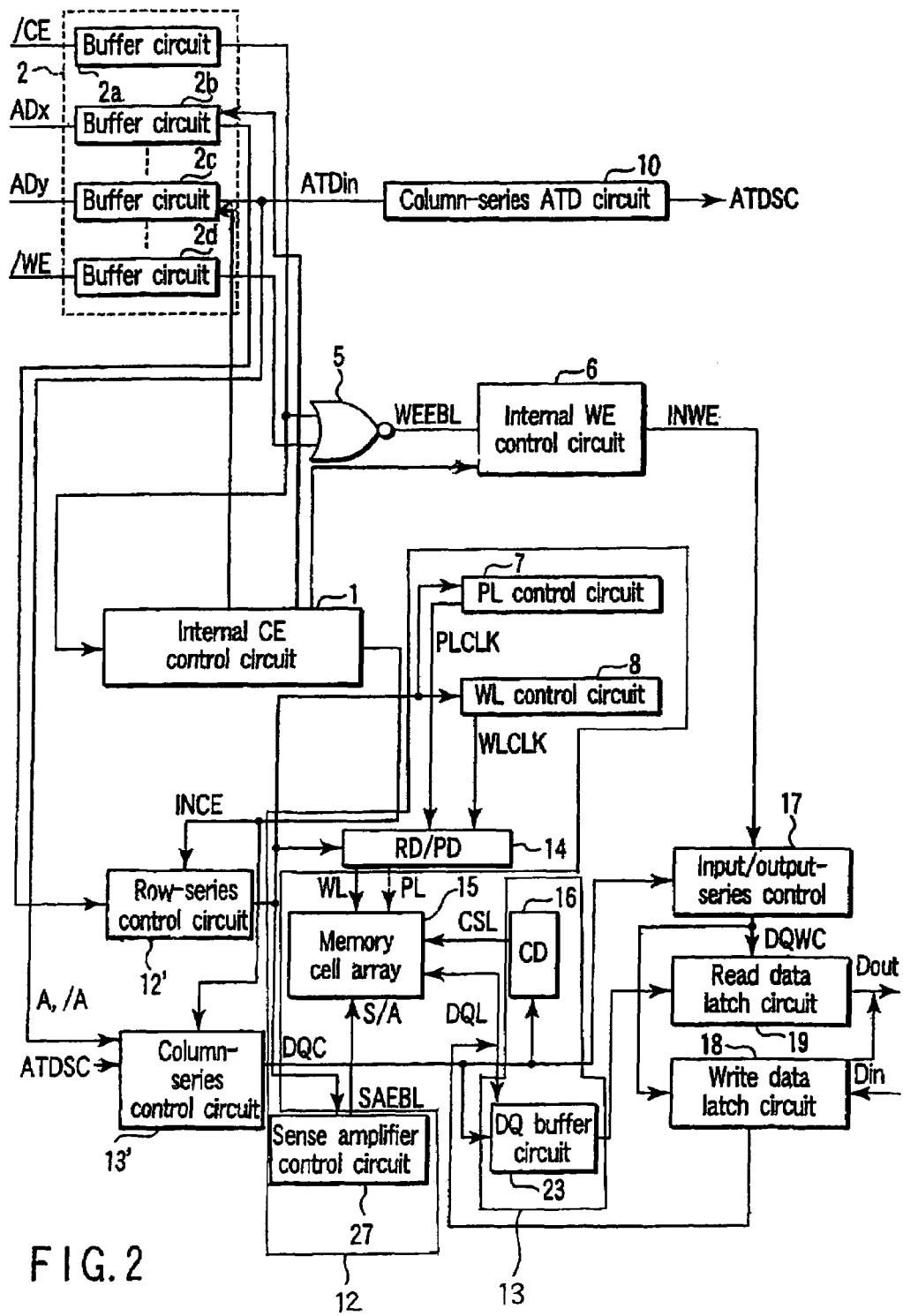
FIG. 2 is a block diagram showing the schematic configuration of the pseudo SRAM mounted on the semiconductor integrated circuit device, for illustrating the semiconductor integrated circuit device according to the first embodiment of this invention.

There will now be described embodiments of this invention with reference to the accompanying drawings. In this explanation, common reference symbols are attached to like portions throughout the drawings.

[First Embodiment]

A first embodiment is a synchronous type pseudo SRAM in which the clock operation for a column address signal and an external write enable signal /WE is made unnecessary in the write operation in the high-speed operation mode such as a static column mode.

FIG. 1 is a block diagram showing an example of the schematic configuration of a pseudo SRAM mounted on a semiconductor integrated circuit device according to the first embodiment of this invention. The schematic configuration example associated with the read and write operations of the pseudo SRAM mounted on the semiconductor integrated circuit device according to the first embodiment of this invention is explained below.

As shown in FIG. 1, the pseudo SRAM includes an internal CE (chip enable) control circuit 1, CE buffer circuit 2a, row address buffer circuit 2b, column address buffer circuit 2c, WE (write enable) buffer circuit 2d, internal WE control circuit 6, column-series ATD (address transition) circuit 10, row-series circuit 12, column-series circuit 13, memory cell array 15 and the like.

An external chip enable signal /CE which specifies start of the operation of the memory cell array 15 is input to the CE buffer circuit 2a and a row address signal ADx which specifies a row address of the memory cell array 15 is input to the row address buffer circuit 2b. A column address signal ADy which specifies a column address of the memory cell array 15 is input to the column address buffer circuit 2c and an external write enable signal /WE which specifies the write operation of the memory cell array 15 is input to the WE buffer circuit 2d. Output signals of the CE buffer circuit 2a and row address buffer circuit 2b are supplied to the row-series circuit 12. An output signal of the column address buffer circuit 2c is supplied to the column-series ATD circuit 10. The column-series ATD circuit 10 detects transition of the column address signal ADy and generates a detection signal (ATD signal) ATDSC necessary for the operation of the column-series circuit 13. An output signal of the WE buffer circuit 2d is supplied to the internal WE control circuit 6. An output signal (internal write enable signal) INWE of the internal WE control circuit 6 is supplied to the column-series circuit 13.

An Output signal of the CE buffer circuit 2a is supplied to the internal CE control circuit 1. Then, the internal CE control circuit 1 generates an internal chip enable signal INCE to control the operations of the row-series circuit 12 and column-series circuit 13. At the same time, it controls the row address buffer circuit 2b, column address buffer circuit 2c and internal WE control circuit 6.

An access operation of the memory cell array 15 is performed by use of the row-series circuit 12 and column-series circuit 13 to permit read data Dout to be output from the memory cell array 15 or permit write data Din to be input to the memory cell array 15.

FIG. 2 is a detailed block diagram of the main portion of the semiconductor integrated circuit device of FIG. 1 and a peripheral circuit portion thereof. The main portion and the peripheral circuit portion of the semiconductor integrated circuit device according to the first embodiment of this invention are explained below.

As shown in FIG. 2, the row-series circuit 12 including a plate line (PL) control circuit 7, word line (WL) control circuit 8, row decoder/plate decoder (RD/PD) 14 and sense amplifier (S/A) control circuit 27, a row-series control circuit 12' which controls the row-series circuit 12, the column-series circuit 13 including a column decoder (CD) 16 and data (DQ) buffer 23, a column-series control circuit 13' which controls the column-series circuit 13, an NOR circuit 5, an input/output-series control circuit 17, a write data latch circuit 18 and a read data latch circuit 19 are provided in the peripheral portion of the memory cell array 15.

Output signals of the buffer circuits 2a, 2d are supplied to the input terminals of the NOR circuit 5. The NOR circuit 5 supplies a signal WEEBL which starts the write operation to the internal WE control circuit 6 when the external chip enable signal /CE and external write enable signal /WE are both set at the "L" level. Then, the internal write enable signal INWE of the internal WE control circuit 6 is supplied to the input/output-series control circuit 17.

The operations of the plate line control circuit 7, word line control circuit 8, row decoder/plate decoder 14 and sense amplifier control circuit 27 are controlled by an output signal of the row-series control circuit 12'. At this time, an output signal PLCLK of the plate line control circuit 7 and an output signal WLCLK of the word line control circuit 8 are supplied to the row decoder/plate decoder 14. Then, the word line WL and plate line PL in the memory cell array 15 are selected and driven by use of the row decoder/plate decoder 14. Further, the sense amplifier S/A in the memory cell array 15 is driven by a sense amplifier enable signal SAEBL output from the sense amplifier control circuit 27.

The operations of the column decoder 16, input/output-series control circuit 17 and DQ buffer 23 are controlled by a column-series control signal DQC of the column-series control circuit 13'. In this case, a column selection line CSL in the memory cell array 15 is selected by the column decoder 16. Further, the operations of the read data latch circuit 19 and write data latch circuit 18 are controlled by an output signal DQWC of the input/output-series control circuit 17. The operation of the read data latch circuit 19 is controlled by an output signal of the DQ buffer 23.

Write data Din to be written into the selected cell selected in the memory cell array 15 is first latched in the write data latch circuit 18 and then written via the data line DQL. On the other hand, data read out from the selected cell is supplied to the DQ buffer 23 via the data line DQL, supplied to and latched in the read data latch circuit 19 and output as read data Dout.

Figure 3:
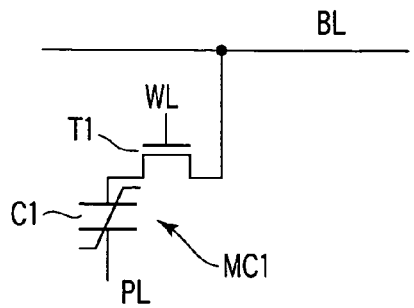
FIG. 3 is an equivalent circuit diagram of a ferro-electric cell having the one-transistor/one-capacitor structure, for illustrating the example of the configuration of the memory cell array shown in FIGS. 1 and 2.

FIG. 3 is an equivalent circuit diagram of a ferro-electric cell which is an example of the memory cell array configuration shown in FIGS. 1 and 2. The configuration of the ferro-electric cell, which is an example of the cell structure in the memory cell array, is explained below.

In the memory cell array 15, ferro-electric cells MC1 each having the one-transistor/one-capacitor structure shown in FIG. 3 are arranged in a matrix form. The ferro-electric cell MC1 has a cell transistor T1 and a cell capacitor C1. One end of the current path of the cell transistor T1 is connected to a bit line BL and the other end of the current path thereof is connected to one end of the cell capacitor C1. The other end of the cell capacitor C1 is connected to a plate line PL and the gate of the cell transistor T1 is connected to a word line WL. In this case, as the capacitor insulating film of the cell capacitor C1, a ferro-electric material such as lead titanate zirconate ($PbZrTiO_3$: PZT) or the like is used.

Figure 4:
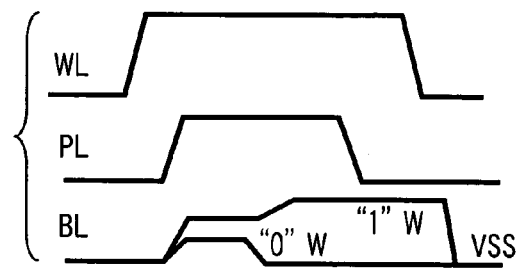
FIG. 4 is a timing chart showing the operation waveforms of the ferro-electric cell of FIG. 3.
Figure 5:
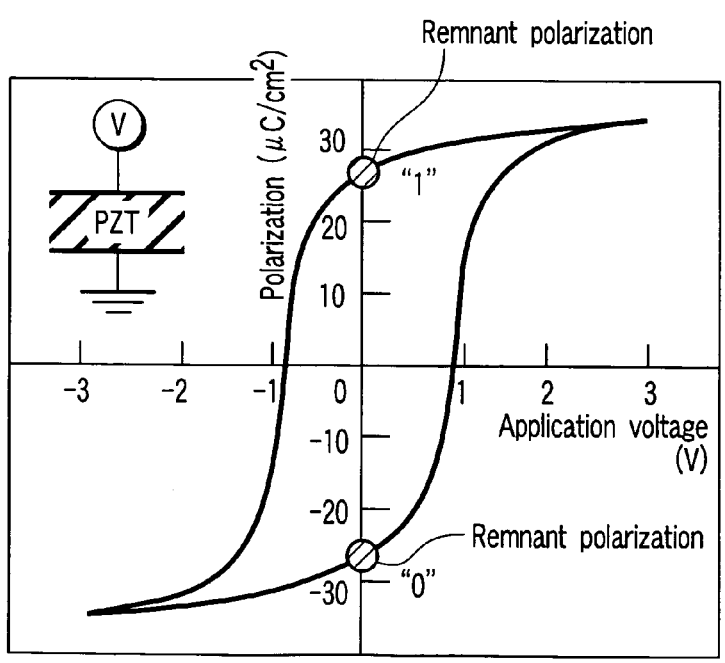
FIG. 5 is a characteristic diagram showing one example of the relation (hysteresis characteristic) between the application voltage of the ferro-electric capacitor of FIG. 3 and the residual dielectric polarization.

FIG. 4 is a timing chart showing the operation waveforms of the ferro-electric cell of FIG. 3. FIG. 5 shows one example of the relation (hysteresis characteristic) between the application voltage of the ferro-electric capacitor of FIG. 3 and the residual dielectric polarization. Next, the data write/read/rewrite operation of the ferro-electric cell is briefly explained below.

First, the data write operation with respect to the ferro-electric cell MC1 is performed as follows. That is, data on the bit line BL can be written by pulse-driving the plate line PL from the ground potential ("L" level) to preset potential ("H" level) and then returning the potential of the plate line PL to the "L" level while the word line WL is kept selected.

The operation of reading out stored data from the ferro-electric cell MC1 can be performed by pulse-driving the plate line PL from the "L" level to the "H" level in a selected state of the word line WL to read charges onto the bit line BL.

That is, the cell capacitor C1, which configures a ferro-electric cell MC1 of a nonvolatile memory shown in FIG. 3 is set in one of two polarization states: the upward and downward directions, as indicated by "0" and "1" in FIG. 5, while no voltage is applied between the electrodes. If voltage is applied between the electrodes, the polarization is not inverted in the case of "1" state and the polarization is inverted in the case of "0" state. The amounts of charges required for applying the same voltage in the two states of "0" and "1", that is, the amounts of charges caused on one-side electrodes according to the storage states of "0", "1" when the same voltage is applied to the other electrodes are different from each other. Therefore, stored data is read out by detecting the difference between the amounts of charges.

Since the above operation of reading out data of the ferro-electric memory is destructive readout, it is always necessary to perform the following rewrite operation after the read operation is performed.

In the operation of rewriting data of the ferro-electric cell MC1 shown in FIG. 3, as shown in FIG. 4, the operation of rewriting data of "0" is performed when readout data is sensed and amplified by the sense amplifier at the readout time in a case where the readout data is "0". On the other hand, when the readout data is "1", the potential of the plate line PL is returned from the "H" level to the "L" level and then the operation of rewriting data "1" is started.

Figure 6:
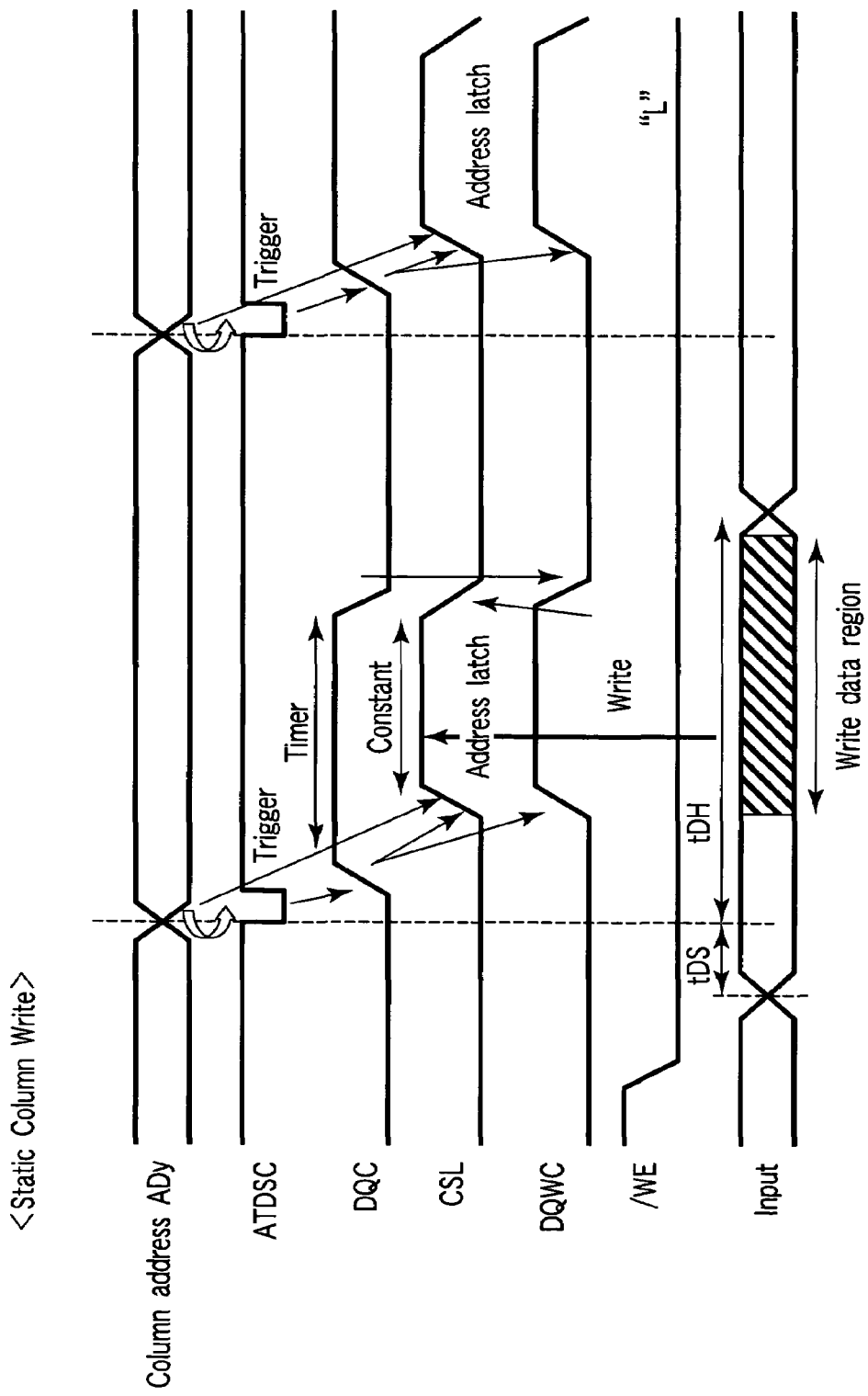
FIG. 6 is a schematic timing chart showing the static column write operation of the pseudo SRAM shown in FIGS. 1 and 2, for illustrating the operation of the semiconductor integrated circuit device according to the first embodiment of this invention.

FIG. 6 is a schematic timing chart showing the write operation of the semiconductor integrated circuit device according to the first embodiment of this invention. Next, the outline of the static column write operation according to the first embodiment is explained below by use of FIG. 6.

If the column-series ATD circuit 10 detects address transition of the column address signal ADy, a pulse signal ATDSC is generated from the column-series ATD circuit 10. A column-series control signal DQC controlled by the timer of the timeout circuit (constant time) is generated from the column-series control circuit 13' in response to the above pulse signal used as a trigger. The column-series control signal DQC is used to control the period in which the column selection line CSL is selected, an output signal DQWC of the input/output-series control circuit 17 and the operation of the DQ buffer 23.

Therefore, in the present embodiment, the write data fetching time is determined by the address determining time (transition time of the address signal). That is, data setup time tDS and hold time tDH which are based on write data input specifications are defined only by the column address signal ADy without being influenced by the write enable signal/WE.

Figure 7:
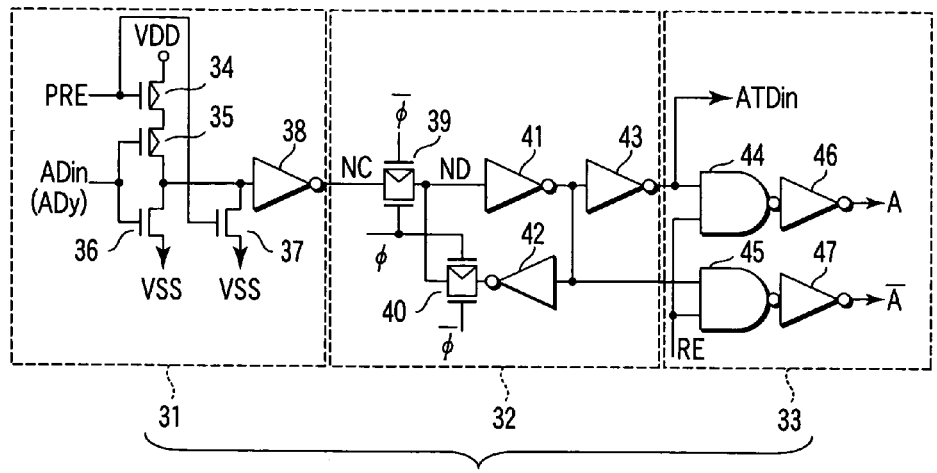
FIG. 7 is a circuit diagram showing an example of the detail configuration of a column address buffer circuit, for illustrating the operation of the semiconductor integrated circuit device according to the first embodiment of this invention.
Figure 8:
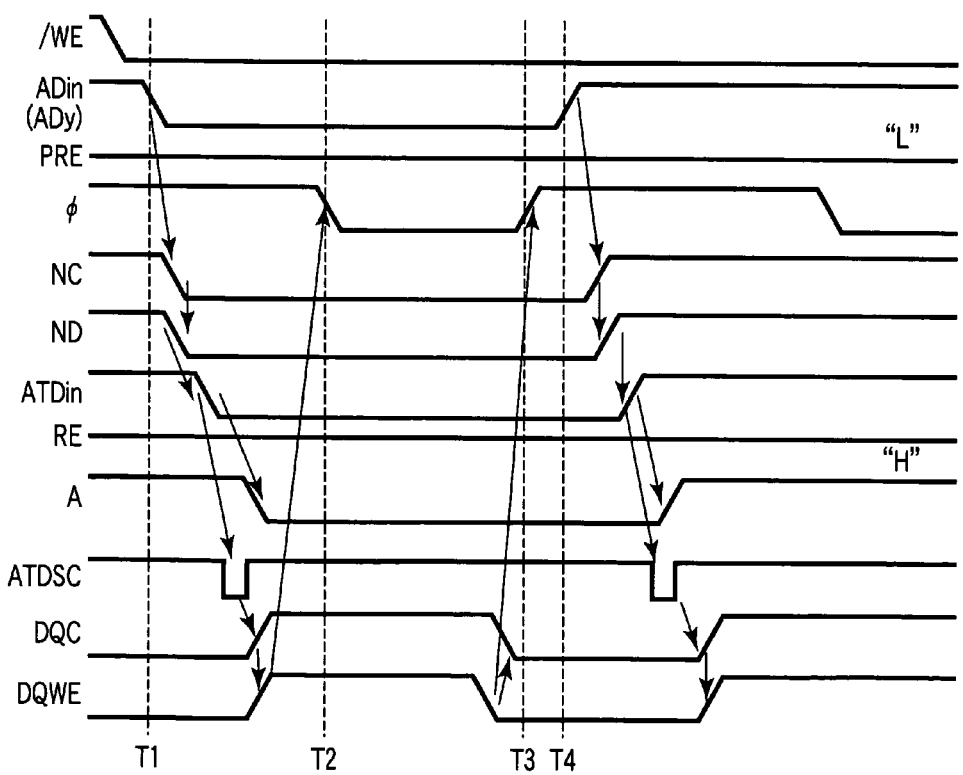
FIG. 8 is a detail timing chart showing the static column write operation of the pseudo SRAM shown in FIGS. 1 and 2, for illustrating the operation of the semiconductor integrated circuit device according to the first embodiment of this invention.

FIG. 7 shows a detailed example of the configuration of the column address buffer circuit used in the semiconductor integrated circuit device according to the first embodiment of this invention. FIG. 8 is a detailed timing chart showing the write operation of the semiconductor integrated circuit device according to the first embodiment of this invention. The configuration and operation of latching an address in the static column write operation according to the first embodiment are specifically explained below by use of FIGS. 7 and 8.

As shown in FIG. 7, the column address buffer circuit 2c shown in FIGS. 1 and 2 includes a buffer 31, first latch 32 and second latch 33.

The buffer 31 includes PMOS transistors 34, 35, NMOS transistors 36, 37 and inverter 38. The current paths of the PMOS transistors 34, 35 and NMOS transistor 36 are serially connected between a power supply node VDD and a ground node VSS. One end of the current path of the NMOS transistor 37 is connected to the connection node of the PMOS transistor 35 and NMOS transistor 36 and the other end thereof is connected to the ground node VSS. The gates of the PMOS transistor 34 and NMOS transistor 37 are supplied with a control signal PRE output from the internal CE control circuit 1. Further, the gates of the PMOS transistor 35 and NMOS transistor 36 are supplied with an address signal ADin (column address signal ADy). The output node NC of the inverter 38 is used as an input of the first latch 32.

The first latch 32 includes switches (for example, MOS switches) 39, 40 and inverters 41, 42, 43. One end of the switch 39 is connected to the output node NC of the inverter 38 and the other end (node ND) thereof is connected to the input terminal of the inverter 41 and one end of the switch 40. The output terminal of the-inverter 41 is connected to the input terminal of the inverter 43 and the other end of the switch 40 is connected to the output terminal of the inverter 42. The ON/OFF states of the switches 39, 40 are controlled in a complementary fashion in synchronism with control signals φ and /φ output from the internal CE control circuit 1. Then, an output signal ATDin of the inverter 43 is input to the column-series ATD circuit 10.

The second latch circuit 33 includes NAND circuits 44, 45 and inverters 46, 47. One input terminal of the NAND circuit 44 is connected to the output terminal of the inverter 43 and the other input terminal thereof is supplied with a control signal RE output from the internal CE control circuit 1. One input terminal of the NAND circuit 45 is connected to the output terminal of the inverter 41 and the other input terminal thereof is supplied with the control signal RE output from the internal CE control circuit 1. The output terminals of the NAND circuits 44, 45 are respectively connected to the input terminals of the inverters 46, 47. In this configuration, complementary address outputs A and /A (internal column address signals) are obtained from the output terminals of the inverters 46, 47.

As shown in FIG. 8, in the static column write operation, the control signal PRE of the buffer circuit 31 is set at the "L" level to set the MOS transistor 34 in the ON state and set the MOS transistor 37 in the OFF state. At this time, since the MOS transistors 35, 36 are set in the inverter operable state (in which the power supply voltage is applied to the buffer 31), the buffer 31 is set in a state in which the address signal ADin (column address signal ADy) can be fetched. Further, the control signal φ of the first latch 32 is set at the "H" level (the control signal /φ is set at the "L" level), the control signal RE of the second latch 33 is set at the "H" level and thus the first latch 32 and second latch 33 are set in the data fetch possible state.

First, assume that address transition from the "H" level to the "L" level occurs in the address signal ADin (column address signal ADy) at time T1. Then, the output node NC of the buffer 31 is set from the "H" level to the "L" level and the node ND of the first latch 32 is also set from the "H" level to the "L" level. As a result, the output signal ATDin of the first latch 32 is also set from the "H" level to the "L" level. The address transition of the signal ATDin is detected by the column-series ATD circuit 10 which in turn generates a pulse signal ATDSC. A column-series control signal DQC and control signal DQWE of desired length are generated based on the pulse signal ATDSC. In this case, the operations of the column decoder 16, input/output-series control circuit 17 and DQ buffer 23 are controlled by the column-series control signal DQC. Further, the write operation of the write data latch circuit 18 is controlled by the control signal DQWE. At this time, the address output A is set at the "L" level (the address output /A is set at the "H" level).

Next, assume that the control signal φ of the first latch 32 is set from the "H" level to the "L" level at time T2. Then, the switch 39 is set in the OFF state and the switch 40 is set in the ON state to electrically disconnect the buffer 31 and first latch 32 from each other. As a result, a state in which the address signal ADin (column address signal ADy) cannot be fetched is set up and the "L" level of the address output A ("H" level of the address output /A) is latched.

When the control signal DQWE terminates a constant pulse period and is set from the "H" level to the "L" level at time T3, the control signal φ of the first latch 32 is set from the "L" level to the "H" level. As a result, a state in which a next address signal ADin (column address signal ADy) can be fetched is set up.

At time T4, a next cycle is started and a next address signal ADin (column address signal ADy) is fetched.

As explained above, with the semiconductor integrated circuit device having the pseudo SRAM mounted thereon according to the first embodiment of this invention, in a period in which the column selection line CSL is selected, a column address input at the present time is latched and a state in which another column selection line CSL will be simultaneously selected (multi-selected) does not occur. Therefore, in the present embodiment, since the clock operation for the external write enable signal /WE is made unnecessary in the write operation of the static column mode, a complete asynchronous operation with respect to an external input signal can be realized and cell data can be prevented from being destroyed.

In this example, the inverter type circuit of FIG. 7 is shown as an example of the configuration of the column address buffer circuit 2c, but the buffer circuit is not limited to the above configuration. For example, a known current mirror type or dynamic latch type circuit can be used. Further, any type of configuration which includes a buffer and latch and in which the buffer and latch can be interrupted from each other by use of a switch circuit can be used.

[Second Embodiment]

In the first embodiment, the static column write operation system in the semiconductor integrated circuit device of the synchronous type with respect to the chip enable signal /CE is explained. However, in the second embodiment, the static column write operation system in a semiconductor integrated circuit device of an asynchronous type is explained.

FIG. 9 is a block diagram showing an example of the schematic configuration of a pseudo SRAM mounted on the semiconductor integrated circuit device according to the second embodiment of this invention. The schematic configuration example associated with the read and write operations of the pseudo SRAM mounted on the semiconductor integrated circuit device according to the second embodiment of this invention is explained below.

As shown in FIG. 9, the configuration of the semiconductor integrated circuit device of the asynchronous type according to the second embodiment differs from that of the first embodiment in that an asynchronous row/column-series ATD circuit 11 and a mode determination circuit 26 which determines one of row access and column access to be made are additionally provided in the configuration of the first embodiment.

The row/column-series ATD circuit 11 is supplied with output signals of buffer circuits 2a to 2d. Further, the row/column-series ATD circuit 11 is supplied with a mode determination signal SC output from the mode determination circuit 26 and supplies a row/column-series detection signal (ATD signal) ATDSUM to an internal CE control circuit 1.

The mode determination circuit 26 is supplied with mode addresses (row addresses) from the buffer circuits 2b, 2c, a sense amplifier enable signal SAEBL from the row-series circuit 12 and an ATD signal ATDSC from the column-series ATD circuit 10. The mode determination circuit 26 determines which one of the row access and column access is to be made, based on the above signals, and generates the mode determination signal SC. The mode determination signal SC is supplied to the internal CE control circuit 1, column-series ATD circuit 10 and row/column-series ATD circuit 11.

The column-series ATD circuit 10 is supplied with a sense amplifier enable signal SAEBL and mode determination signal SC and supplies an ATD signal ATDSC of the column address to the column-series circuit 13.

Figure 10:
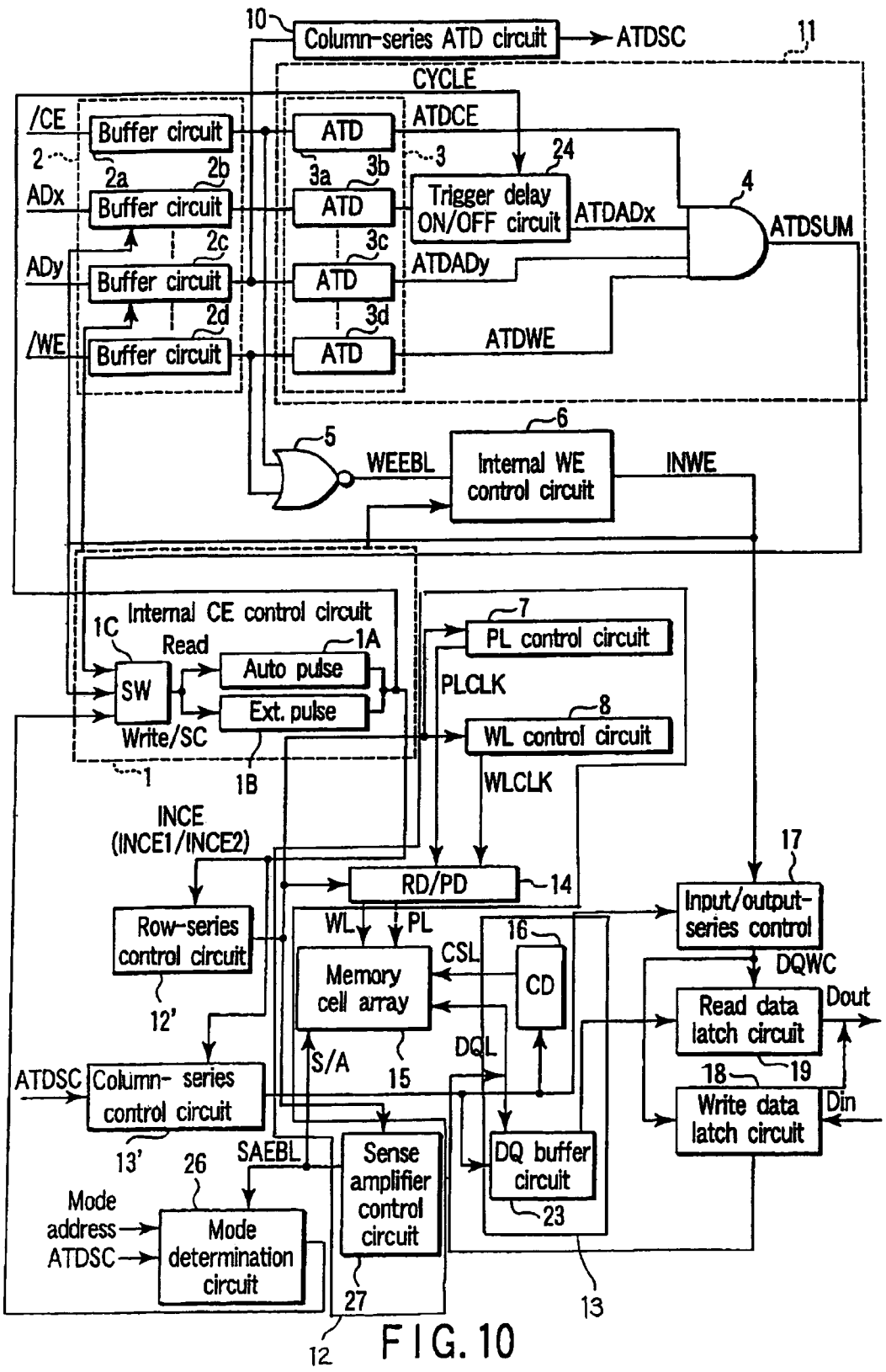
FIG. 10 is a block diagram showing the schematic configuration of the pseudo SRAM mounted on the semiconductor integrated circuit device, for illustrating the semiconductor integrated circuit device according to the second embodiment of this invention.

FIG. 10 is a block diagram showing the detailed configuration of the main portion of the semiconductor integrated circuit device of FIG. 9 and the peripheral circuit portion thereof. The detail configuration of the main portion and the peripheral circuit portion of the semiconductor integrated circuit device according to the second embodiment of this invention is explained.

As shown in FIG. 10, the row/column-series ATD circuit 11 includes an ATD circuit 3, AND circuit 4 and trigger delay ON/OFF circuit 24. The ATD circuit 3 includes ATDs 3a to 3d which are supplied with output signals of the buffer circuits 2a to 2d and detect transitions of the respective output signals. Signals ATDCE, ATDADy and ATDWE indicating the results of detection output from the ATDs 3a, 3c, 3d are supplied to input terminals of the AND circuit 4. A signal ATDADx indicating the result of detection output from the ATD 3b is supplied to the AND circuit 4 via the trigger delay ON/OFF circuit 24. The trigger delay ON/OFF circuit 24 is supplied with and controlled by a control signal CYCLE output from the internal CE control circuit 1 and defining the cycle. The trigger delay ON/OFF circuit 24 is used to prevent reception of a transition trigger of the row address signal ADx within the cycle and permit the transition trigger to be received after the end of the cycle. A pulse-like logical AND signal ATDSUM output from the AND circuit 4 in response to transition of one of an external chip enable signal /CE, external write enable signal /WE and address signals ADx, ADy used as a trigger is supplied to the internal CE control circuit 1.

Output signals of the buffer circuits 2a, 2d are supplied to input terminals of the NOR circuit 5. The NOR circuit 5 supplies a signal WEEBL used to start the write operation to the internal WE control circuit 6 when both of the external chip enable signal /CE and external write enable signal /WE are set at the "L" level.

The internal CE control circuit 1 includes a pulse generator (Auto pulse) 1A, pulse generator (Ext. pulse) 1B and switch (SW) 1C. The pulse generator (Auto pulse) 1A functions as an internal timeout circuit and outputs a pulse signal with preset width. The pulse generator (Ext. pulse) 1B outputs a pulse signal in response to transition of the external write enable signal /WE at the write operation time and mode switching time.

The switch 1C is supplied with the logical AND signal ATDSUM output from the AND circuit 4, the internal write enable signal INWE output from the internal WE control circuit 6 and a mode determination signal SC output from the mode determination circuit 26. The signal selected by the switch 1C is supplied to the pulse generators 1A, 1B. Then, internal chip enable signals INCE (INCE1/INCE2) output from the pulse generators 1A, 1B are supplied to the row-series control circuit 12' and column-series control circuit 13'. Further, the control signal CYCLE which specifies the cycle is supplied to the trigger delay ON/OFF circuit 24.

The mode determination circuit 26 is supplied with a sense amplifier enable signal SAEBL output from a sense amplifier control circuit 27. Further, the mode determination circuit 26 is supplied with a mode address and an ATD signal ATDSC of a column address output from the column-series ATD circuit 10 to generate a mode determination signal SC which is supplied to the switch 1C.

The reason why the mode determination of the row access and column access in the pseudo SRAM by the mode determination circuit 26 is required is as follows. That is, the row access (normal mode) and column access (static column mode) operation in the circuit of FIG. 10 is the same as the operation until the word line WL is selected, but the operation performed after the word line selection is different. Specifically, in the row access operation, the standby state (precharge cycle) is set when a preset period of time (internal delay) has elapsed after the internal chip enable signal INCE was generated based on the ATD signal ATDSUM of the row/column-series ATD circuit 11. On the other hand, in the column access operation, it is necessary to prevent the standby state from being set during the access period and set the standby state after detection of the end of the access.

Figure 11:
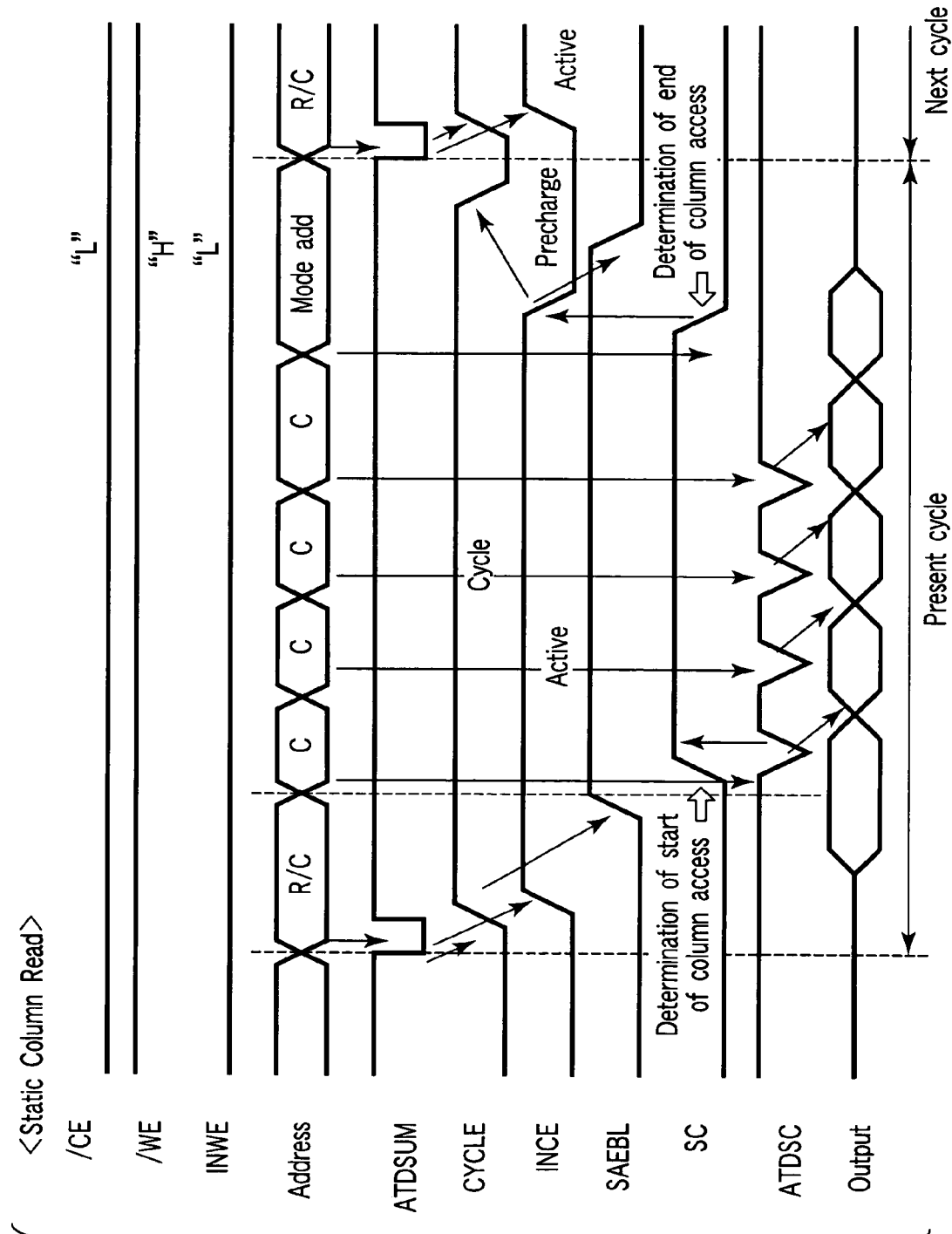
FIG. 11 is a timing chart showing the static column read operation of the pseudo SRAM shown in FIGS. 9 and 10, for illustrating the semiconductor integrated circuit device according to the second embodiment of this invention.
Figure 12:
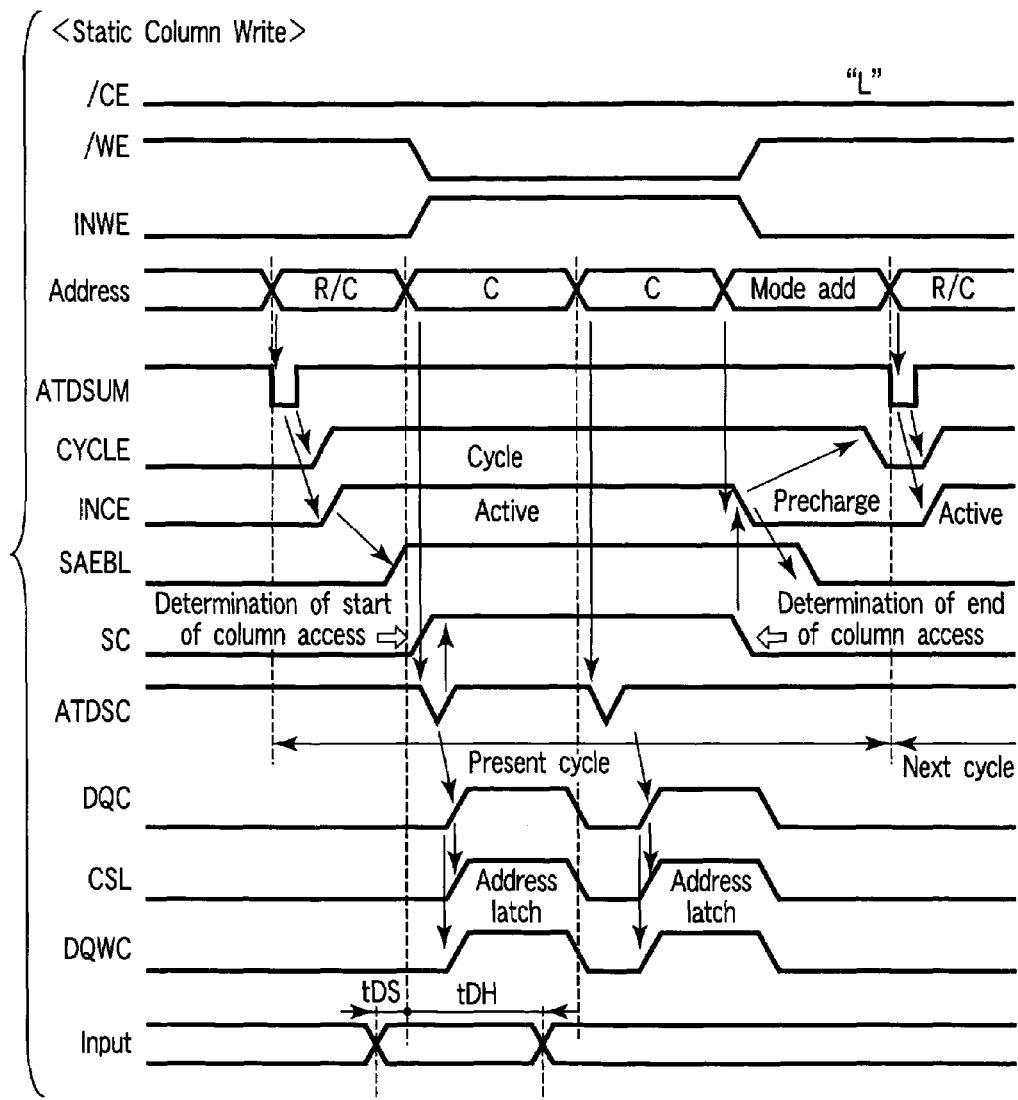
FIG. 12 is a timing chart showing the static column write operation of the pseudo SRAM shown in FIGS. 9 and 10, for illustrating the semiconductor integrated circuit device according to the second embodiment of this invention.

FIG. 11 is a schematic timing chart showing the read operation of the semiconductor integrated circuit device according to the second embodiment of this invention. FIG. 12 is a schematic timing chart showing the write operation of the semiconductor integrated circuit device according to the second embodiment of this invention.

In the second embodiment, an asynchronous system is shown. In the asynchronous system, access is started to be made irrespective of the row or column when transition of the address starts. In this case, however, the first access is row access and column access cannot be started in the system if the row access is not ended. Therefore, in the addresses shown in FIGS. 11 and 12, an address of either the row or column can be input at the time of "R/C" and thus both of the row and column can be accessed. In practice, column access is made after the row access is completed. Further, since the mode determination signal SC is set at the "H" level and the static column mode is set at the time of "C", only the column access can be made. At the time of "Mode add", an address signal which is used to determine the end of the static column mode is indicated and the signal corresponds to a row address or a preset address signal.

Next, the static column read operation and static column write operation of the second embodiment is concretely explained below.

As shown in FIG. 11, in the static column read operation, when address transition is detected and the logical AND signal ATDSUM output from the row/column-series ATD circuit 11 generates a pulse ("H"→"L"→"H"), the control signal CYCLE, internal chip enable signal INCE and sense amplifier enable signal SAEBL are set at the "H" level a short time later, with the pulse as a trigger.

Then, the mode determination signal SC is set to the "H" level and the static column read operation is started. In a period of time until the mode determination signal SC is set to the "L" level, an output signal INCE of the internal CE control circuit 1 is kept at the "H" level. Therefore, the internal CE control circuit 1 functions as a pulse generator which generates a pulse signal (Ext. pulse) kept at the "H" level in a period from the time the logical AND signal ATDSUM is set to the "L" level until the time the mode determination signal SC is set to the "L" level.

On the other hand, as shown in FIG. 12, in the static column write operation, when address transition is detected and the logical AND signal ATDSUM output from the row/column-series ATD circuit 11 generates a pulse ("H"→"L"→"H"), the control signal CYCLE, internal chip enable signal INCE and sense amplifier enable signal SAEBL are set at the "H" level a short time later, with the pulse as a trigger.

Then, if the mode determination signal SC is set to the "H" level and the static column write operation is started, an output signal INCE of the internal CE control circuit 1 is kept at the "H" level in a period until the internal write enable signal INWE is set to the "H" level and the mode determination signal SC is set to the "L" level. Therefore, the internal CE control circuit 1 functions as a pulse generator which generates a pulse signal (Ext. pulse) kept at the "H" level in a period from the time the logical AND signal ATDSUM is set to the "L" level until the time the mode determination signal SC is set to the "L" level.

In the static column write operation mode, the column-series ATD circuit 10 outputs a pulse signal ATDSC when address transition is detected. Then, a column-series control signal DQC of desired length is generated based on the pulse signal ATDSC. In a period of time in which the column selection line CSL is selected, a column address input at this time point is latched by use of the column-series control signal DQC.

In the mode determination in the static column operation mode, transition of the column address is detected (set), the mode start operation to make static column access is determined and the mode determination signal SC is set to the "H" level after the condition that the memory cell array 15 can start the column access operation is satisfied. Then, the mode determination signal SC is set to the "L" level if address transition is detected in a case where a row address is input or a predetermined mode address is input after transitions of successive column addresses. As a result, the control operation is performed to determine the mode end (reset) of the static column access and set the standby state.

In this case, the condition that the memory cell array can start the column access operation specifically indicates a case wherein the sense amplifier enable signal SAEBL of the sense amplifier control circuit 27 is set at the "H" level.

Further, as the predetermined mode address, for example, (1) a command address used when a mode is determined by using "0", "1" of a certain address or a combination of "0" and "1" of a plurality of addresses as a command instruction, (2) a page address used in the pseudo SRAM having a page mode and the like are provided.

The mode determination method is not limited to the above method. For example, it is possible to automatically determine which one of the row access (normal mode) and column access (static column mode) is made based on the interval between address transitions as is disclosed in Jpn. Pat. Appln. KOKAI Publication No. 2002-269977.

As explained above, like the synchronous type semiconductor integrated circuit device according to the first embodiment, in the semiconductor integrated circuit device having the asynchronous type pseudo SRAM mounted thereon according to the second embodiment of this invention, a column address input at the current time is latched in a period of time in which the column selection line CSL is selected and a state in which another column selection line CSL is simultaneously selected (multi-selected) can be prevented from occurring. Therefore, in the present embodiment, since the clock operation for the external write enable signal /WE is made unnecessary in the write operation of the static column mode, a complete asynchronous operation with respect to an external input signal can be realized and cell data can be prevented from being destroyed.

[Third Embodiment]

A third embodiment is a modification of the second embodiment and shows a configuration which can be obtained by providing two-series circuits having a lower bit (LB) circuit and an upper bit (UB) circuit in the configuration of the second embodiment and in which a byte control operation can be performed.

Figure 13:
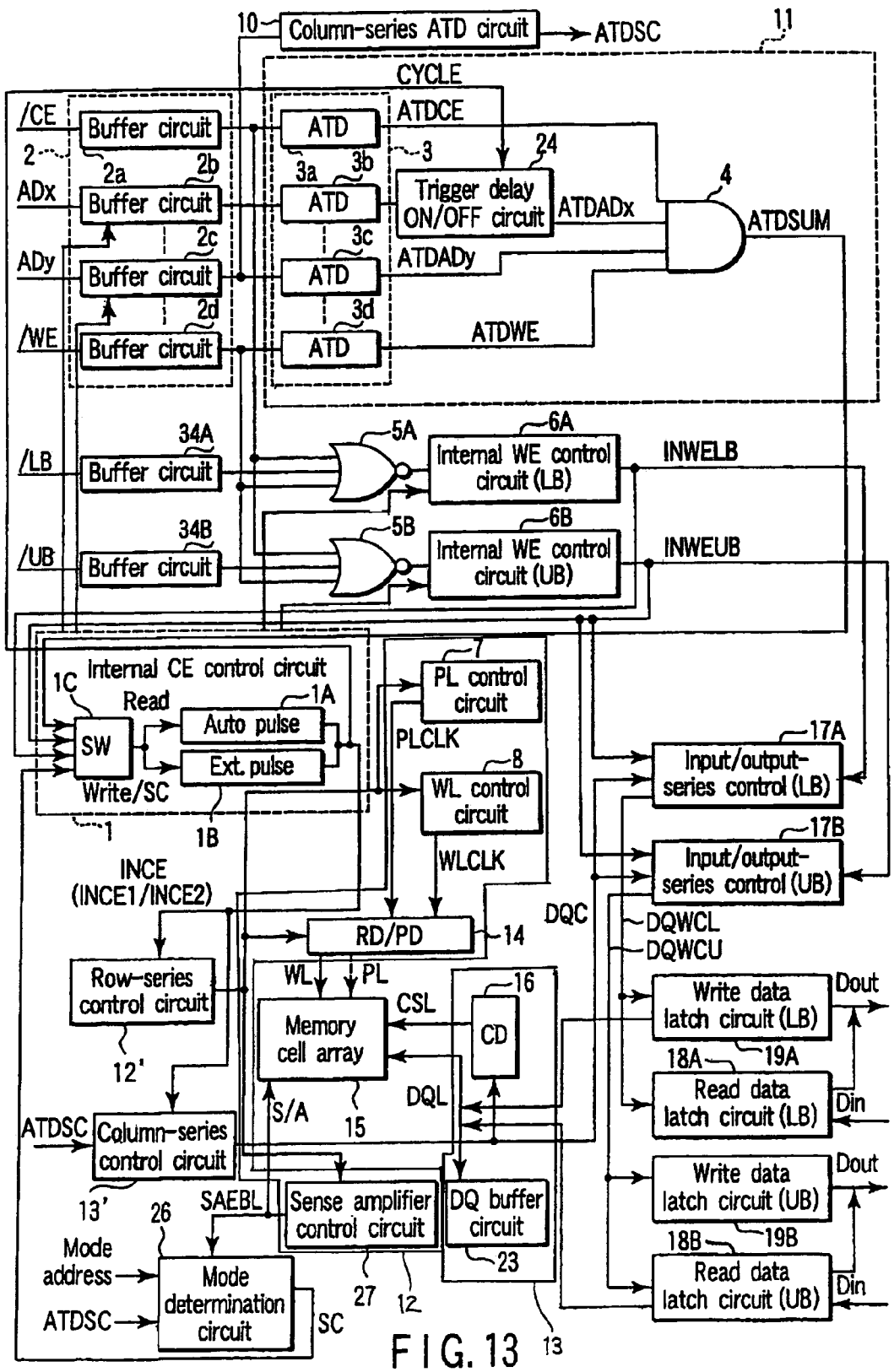
FIG. 13 is a block diagram showing the schematic configuration of a pseudo SRAM mounted on a semiconductor integrated circuit device, for illustrating the semiconductor integrated circuit device according to a third embodiment of this invention.

FIG. 13 is a block diagram showing the schematic configuration of a pseudo SRAM mounted on a semiconductor integrated circuit device according to the third embodiment of this invention. The schematic configuration example associated with the read and write operations of the pseudo SRAM mounted on the semiconductor integrated circuit device according to the third embodiment of this invention is explained below.

As shown in FIG. 13, in the third embodiment, the configuration of the second embodiment is modified to separately provide two-series circuits for the lower bits (LB) and upper bits (UB) so as to permit the byte control operation to be performed.

That is, the internal WE control circuit 6 of the second embodiment is divided into a lower bit internal WE control circuit (LB) 6A and upper bit internal WE control circuit (UB) 6B and the NOR circuit 5 of the second embodiment is divided into a lower bit NOR circuit 5A and upper bit NOR circuit 5B. Further, the input/output-series control circuit 17 of the second embodiment is divided into a lower bit input/output-series control circuit (LB) 17A and upper bit input/output-series control circuit (UB) 17B and the write data latch circuit 18 of the second embodiment is divided into a lower bit write data latch circuit (LB) 18A and upper bit write data latch circuit (UB) 18B. In addition, the read data latch circuit 19 of the second embodiment is divided into a lower bit read data latch circuit (LB) 19A and upper bit read data latch circuit (UB) 19B. Further, buffer circuits 34A, 34B for the lower bits and upper bits are provided.

The buffer circuit 34A is supplied with a lower bit signal /LB and the buffer circuit 34B is supplied with an upper bit signal /UB. The NOR circuit 5A is supplied with output signals of the buffer circuits 2a, 2d, 34A and the NOR circuit 5B is supplied with the output signals of the buffer circuits 2a, 2d, 34B. The internal WE control circuit 6A is supplied with an output signal of the NOR circuit 5A and the internal WE control circuit 6B is supplied with an output signal of the NOR circuit 5B. Output signals INWELB, INWEUB of the internal WE control circuits 6A, 6B are respectively supplied to the input/output-series control circuits 17A, 17B and the switch 1C of the internal CE control circuit 1.

The input/output-series control circuits 17A, 17B are supplied with the control signal DQC of the column-series control circuit 13' and the output signals INWELB, INWEUB of the internal WE control circuits 6A, 6B. Control signals DQWCL, DQWCU of the input/output-series control circuits 17A, 17B are respectively supplied to the write data latch circuits 18A, 18B and read data latch circuits 19A, 19B.

As explained above, in the semiconductor integrated circuit device having the pseudo SRAM mounted thereon according to the third embodiment of this invention, the same effect as that of the second embodiment can be attained and the byte control operation can be performed. That is, for example, in the case of the semiconductor integrated circuit device with the 16-bit configuration, the bit configuration is divided into lower 8 bits (LB) and upper 8 bits (UB) and the control operation for the read and write operations can be performed for each unit of the lower bits and upper bits. For example, the byte control operation is extremely effective in a case where a 16-bit configuration product is treated as an 8-bit configuration product or where the read or write operation is performed for each unit of the lower bits or upper bits.

The third embodiment is explained based on the configuration of the second embodiment, but this is not limitative. For example, in the configuration of the first embodiment, it is of course possible to attain a configuration which permits the byte control operation to be performed by providing two-series circuits for the lower bits (LB) and upper bits (UB).

[Fourth Embodiment]

In the first to third embodiments, the pseudo SRAM using the ferro-electric cell array in which the ferro-electric cells MC1 each having the one-transistor/one-capacitor structure are independently connected to the bit lines BL and plate lines PL in the memory core section is explained. On the other hand, in the fourth embodiment, a pseudo SRAM using an array in which series connected parallel-TC unit type ferro-electric cells each used as one unit are connected to the bit lines BL and plate lines PL in the memory core section is explained.

Figure 14:
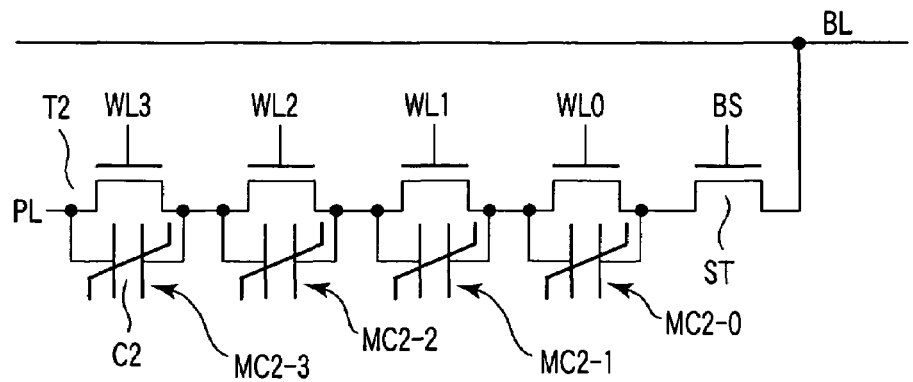
FIG. 14 is an equivalent circuit diagram showing one unit of a series connected parallel-TC unit type ferro-electric cell which is an example of the memory cell array configuration of a semiconductor integrated circuit device according to a fourth embodiment of this invention.
Figure 15:
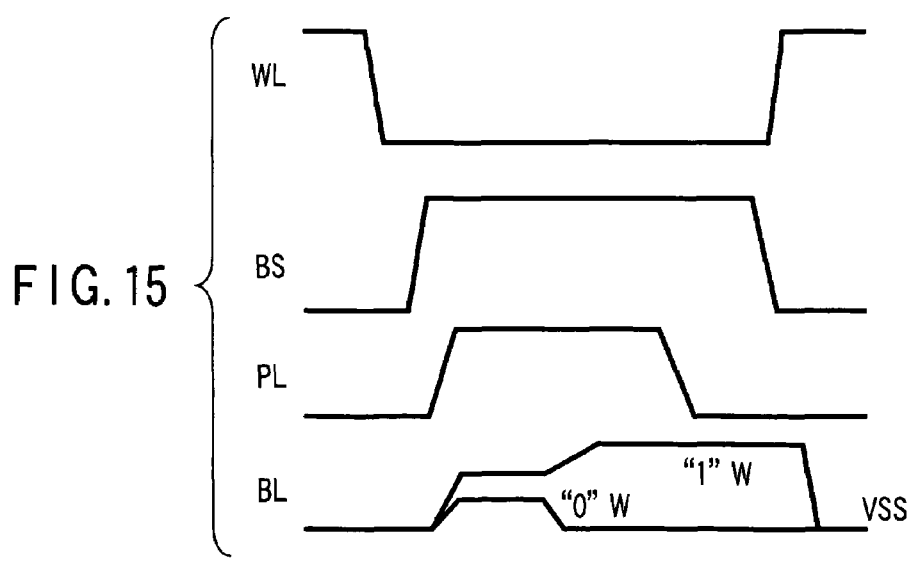
FIG. 15 is a timing chart showing the operation waveforms in the series connected parallel-TC unit type ferro-electric cell of FIG. 14.

FIG. 14 is an equivalent circuit diagram showing one unit of a series connected parallel-TC unit type ferro-electric cell which is an example of part of the memory cell array configuration of a semiconductor integrated circuit device according to the fourth embodiment of this invention. FIG. 15 is a timing chart showing the operation waveforms in the series connected parallel-TC unit type ferro-electric cell of FIG. 14. The configuration and operation of the series connected parallel-TC unit type ferro-electric cell which is one example of the cell configuration in the memory cell array are explained below by use of FIGS. 14, 15.

One unit of the series connected parallel-TC unit type ferro-electric cell is configured by serially connecting a plurality of (four in this example) ferro-electric cells MC2-0 to MC2-3 and the current path of one unit selection transistor ST between the bit line BL and the plate line PL. Each of the ferro-electric cells MC2-0 to MC2-3 is configured by connecting the current path of a cell transistor T2 and a ferro-electric capacitor C2 in parallel. The gates of the cell transistors T2 of the ferro-electric cells MC2-0 to MC2-3 are respectively connected to word lines WL0 to WL3 and the gate of the unit selection transistor ST is connected to a unit selection line BS.

The word lines WL0 to WL3 except one word line which corresponds to a selected ferro-electric cell are set at the "H" level and the cell transistors corresponding to the above word lines are set in the ON state. Only the word line which corresponds to the selected ferro-electric cell is set at the "L" level and the cell transistor corresponding to the above word line is set in the OFF state. Thus, one-side electrode of the cell capacitor of the selected ferro-electric cell is electrically coupled to the bit line BL and the other electrode thereof is electrically coupled to the plate line PL.

As described above, in the semiconductor integrated circuit device having the pseudo SRAM mounted thereon according to the fourth embodiment of this invention, the series connected parallel-TC unit type cell configuration is basically the same as that of the pseudo SRAM using the ferro-electric cells each having the one-transistor/one-capacitor structure in the memory core section as explained in the first to third embodiments. Thus, in the fourth embodiment, the same operation and effect as those of the first to third embodiments can be attained.

[Fifth Embodiment]

In the semiconductor integrated circuit devices according to the first to fourth embodiments, the pseudo SRAM using the ferro-electric cells MC1, MC2 in which the plate line PL is pulse-driven as shown in FIGS. 3 and 14 in the memory core section is explained. In a fifth embodiment, dynamic random access memory cells (DRAM cells) each having the one-transistor/one-capacitor structure are used in the memory core section.

Figure 16:
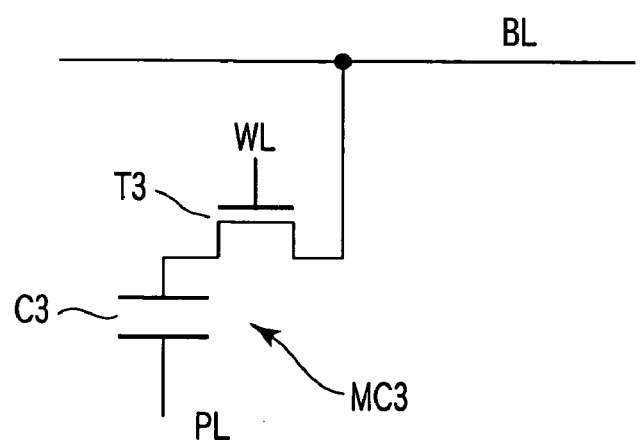
FIG. 16 is an equivalent circuit diagram showing one cell of DRAM cells which is an example of the memory cell array configuration of a semiconductor integrated circuit device according to a fifth embodiment of this invention.
Figure 17:
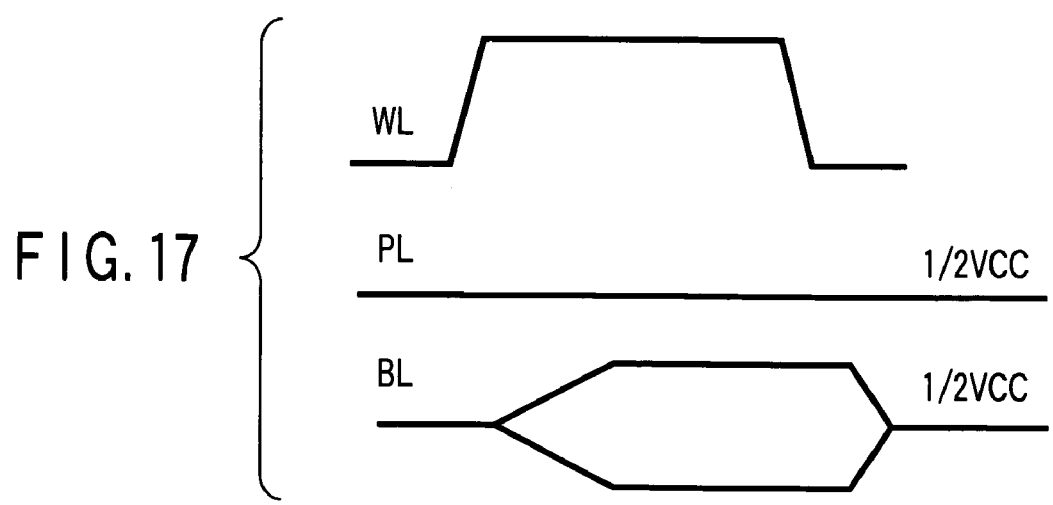
FIG. 17 is a timing chart showing the operation waveforms of the DRAM cell of FIG. 16.
Figure 18:
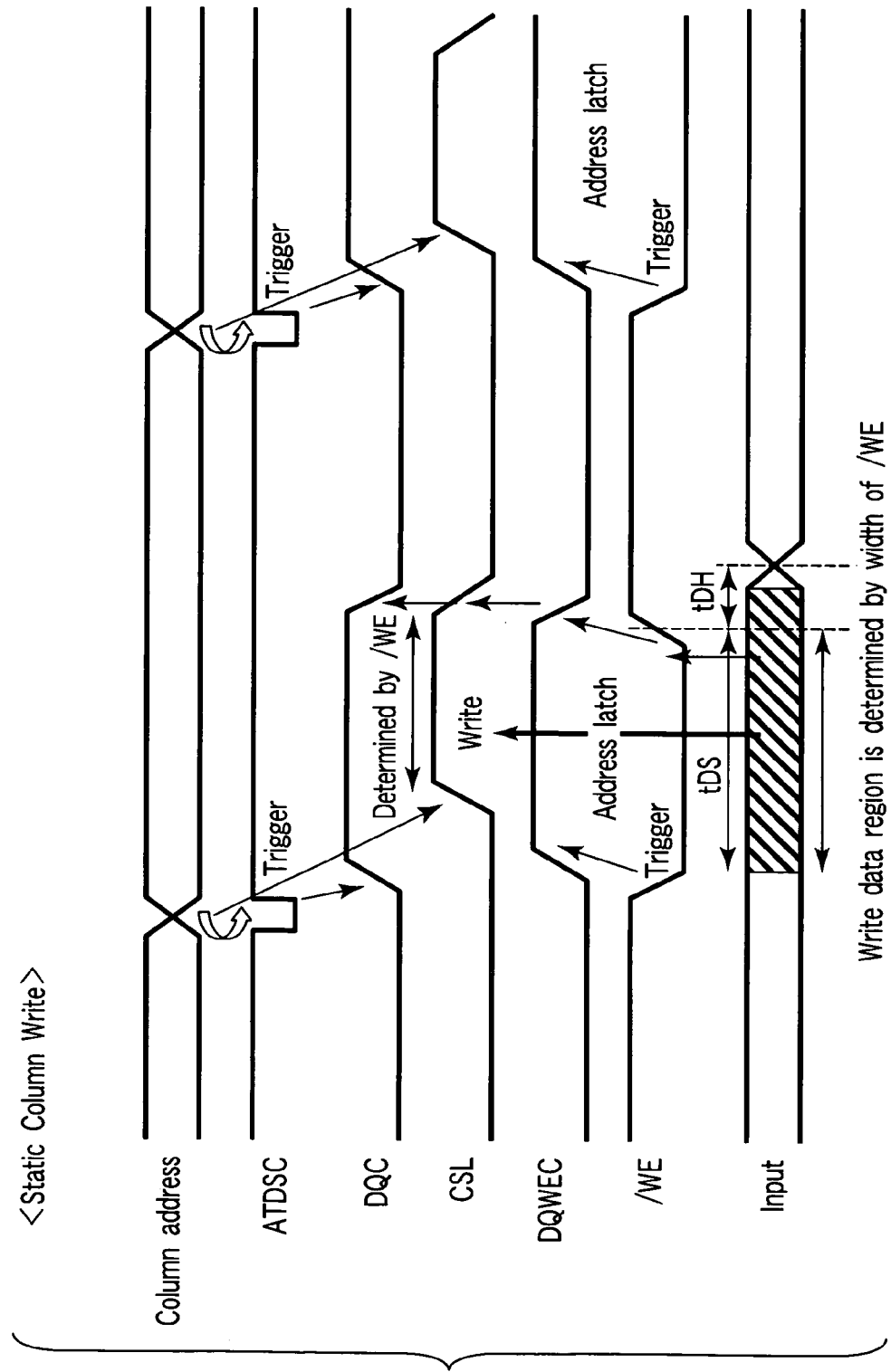
FIG. 18 is a timing chart showing the static column write operation of a synchronous type pseudo SRAM, for illustrating the conventional semiconductor integrated circuit device.

FIG. 16 is an equivalent circuit diagram showing one cell of DRAM cells which is an example of part of the memory cell array configuration of a semiconductor integrated circuit device according to the fifth embodiment. FIG. 17 is a timing chart showing the operation waveforms of the DRAM cell of FIG. 16. The configuration and operation of the DRAM cell which is one example of the cell structure of the memory cell array are explained by use of FIGS. 16 and 17.

In the memory cell array 15, DRAM cells MC3 each having the one-transistor/one-capacitor structure shown in FIG. 16 are arranged in a matrix form. The ferro-electric cell MC3 has a cell transistor T3 and a cell capacitor C3. One end of the current path of the cell transistor T3 is connected to a bit line BL and the other end of the current path is connected to one end of the cell capacitor C3. The other end of the cell capacitor C3 is connected to a plate line PL and the gate of the cell transistor T3 is connected to a word line WL.

As shown in FIG. 17, the word line WL is selected by setting precharge voltage of the bit line BL and potential of the plate line PL to half the power supply voltage VCC.

As explained above, in the semiconductor integrated circuit device having the pseudo SRAM mounted thereon according to the fifth embodiment of this invention, the DRAM cell configuration is basically the same as that of the pseudo SRAM using the ferro-electric cells in the memory core section as explained in the first to fourth embodiments. Thus, in the fifth embodiment, the same operation and effect as those of the first to fourth embodiments can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a memory cell array for which a data write operation is to be performed by an external write enable signal;
an address transition detecting circuit which detects transition of a column address signal, the column address signal being used to specify a column address of the memory cell array;
a control circuit having a timeout circuit, the control circuit which generates an internal circuit control signal of desired length used to control column access to the memory cell array based on a result of detection by the address transition detecting circuit; and
a column selection line whose selection time is controlled by the control circuit,
wherein the column address signal used for selection of the column selection line is latched without clock-operating the external write enable signal in a period of time in which the column selection line is selected at a write operation time, and
wherein a time for fetching data to be written at the write operation time is determined only by a transition time of the column address signal.

2. A semiconductor integrated circuit device comprising:
a memory cell array;
a first address transition detecting circuit which detects at least one of transition of a chip enable signal, transition of a row address signal and a column address signal and transition of a write enable signal, the chip enable signal being used to specify start of the operation of the memory cell array, the row address signal being used to specify a row address of the memory cell array, the column address signal being used to specify a column address of the memory cell array, the write enable signal being used to specify a write operation of the memory cell array;
a first control circuit having a timeout circuit, the first control circuit which generates an internal circuit control signal of desired length used to control row access to the memory cell array based on a result of detection by the first address transition detecting circuit;
a second address transition detecting circuit which detects only transition of the column address signal;
a second control circuit which controls column access to the memory cell array based on a result of detection by the second address transition detecting circuit;
a column selection line whose selection time is controlled by the second control circuit; and
a mode determination circuit which determines start of a column access mode to generate a mode determination signal and set a column access operation when transition of the column address signal is detected by the second address transition detecting circuit in a case where a condition that the column access operation of the memory cell array is acceptable and then determines an end of the column access mode and sets a standby state in a case where transition of one of the row address and a predetermined address is detected,
wherein the column address signal used for selection of the column selection line is latched in a period of time in which the column selection line is selected when the mode determination circuit determines the column access mode at a write operation time.

3. The semiconductor integrated circuit device according to claim 1, further comprising
a buffer circuit which is supplied with the column address signal and power supply voltage, and
a latch circuit which latches an output signal of the buffer circuit.

4. The semiconductor integrated circuit device according to claim 3, wherein the buffer circuit is controlled to be set into an active/non-active state according to supply/non-supply of the power supply voltage.

5. The semiconductor integrated circuit device according to claim 3, further comprising
a switch which is provided between the buffer circuit and the latch circuit and whose conduction state is controlled by a first control signal,
wherein a connection between the buffer circuit and the latch circuit is controlled according to the conduction state of the switch.

6. The semiconductor integrated circuit device according to claim 5, wherein the switch is set into a non-conductive state to disconnect the buffer circuit and the latch circuit from each other when the address transition detecting circuit detects transition of the column address signal.

7. The semiconductor integrated circuit device according to claim 3, wherein the latch circuit includes a first latch which latches the output signal of the buffer circuit in response to a second control signal, and
a second latch which latches an output signal of the first latch in response to a third control signal and generates a complementary signal.

8. The semiconductor integrated circuit device according to claim 7, wherein the address transition detecting circuit detects transition of the column address signal based on the output signal of the first latch.

9. The semiconductor integrated circuit device according to claim 2, wherein the condition that the column access operation of the memory cell array is acceptable is set based on a sense amplifier enable signal, the sense amplifier enable signal is output from a sense amplifier control circuit which is controlled by the first control circuit.

10. The semiconductor integrated circuit device according to claim 1, wherein the memory cell array is configured by ferro-electric cells arranged in a matrix form.

11. The semiconductor integrated circuit device according to claim 1, wherein the memory cell array is configured by series connected parallel-TC unit type ferro-electric cells arranged in a matrix form.

12. The semiconductor integrated circuit device according to claim 1, wherein the memory cell array is configured by dynamic cells arranged in a matrix form.

13. A data write method of a semiconductor integrated circuit device which includes
a memory cell array for which a data write operation is to be performed by an external write enable signal;
an address transition detecting circuit which detects transition of a column address signal, the column address signal being used to specify a column address of the memory cell array;
a control circuit having a timeout circuit, the control circuit which generates an internal circuit control signal of desired length used to control column access to the memory cell array based on a result of detection by the address transition detecting circuit; and
a column selection line whose selection time is controlled by the control circuit, compnsing:
latching the column address signal used for selection of the column selection line without clock-operating the external write enable signal in a period of time in which the column selection line is selected at a write operation time,
wherein a time for fetching data to be written at the write operation time is determined only by a transition time of the column address signal.

14. A data write method of a semiconductor integrated circuit device which includes
a memory cell array;
a first address transition detecting circuit which detects at least one of transition of a chip enable signal, transition of a row address signal and a column address signal and transition of a write enable signal, the chip enable signal being used to specify start of the operation of the memory cell array, the row address signal being used to specify a row address of the memory cell array, the column address signal being used to specify a column address of the memory cell array, the write enable signal being used to specify a write operation of the memory cell array;
a first control circuit having a timeout circuit, the first control circuit which generates an internal circuit control signal of desired length used to control row access to the memory cell array based on a result of detection by the first address transition detecting circuit; a second address transition detecting circuit which detects only transition of the column address signal;
a second control circuit which controls column access to the memory cell array based on a result of detection by the second address transition detecting circuit;
a column selection line whose selection time is controlled by the second control circuit; and
a mode determination circuit which determines start of a column access mode to generate a mode determination signal and set a column access operation when transition of the column address signal is detected by the second address transition detecting circuit in a case where a condition that the column access operation of the memory cell array is acceptable and then determines an end of the column access mode and sets a standby state in a case where transition of one of the row address and a predetermined address is detected, comprising:
latching the column address signal used for selection of the column selection line in a period of time in which the column selection line is selected when the mode determination circuit determines the column access mode at a write operation time.

15. The data write method according to claim 13, wherein the semiconductor integrated circuit device further includes
a buffer circuit which is supplied with the column address signal and power supply voltage and whose active/non-active state is controlled by supply/non supply of the power supply voltage,
a latch circuit which latches an output signal of the buffer circuit and
a switch which is provided between the buffer circuit and the latch circuit and whose conduction state is controlled by a first control signal to make/break a connection between the buffer circuit and the latch circuit according to the conduction state thereof, wherein the switch is set in the non-conductive state to disconnect the buffer circuit from the latch circuit when the address transition detecting circuit detects transition of the column address signal.

16. The data write method according to claim 15, wherein the latch circuit includes a first latch which latches the output signal of the buffer circuit in response to a second control signal and a second latch which latches an output signal of the first latch in response to a third control signal and generates a complementary signal.

17. The data write method according to claim 16, wherein the address transition detecting circuit detects transition of the column address signal based on the output signal of the first latch.

18. The data write method according to claim 14, wherein the condition that the column access operation of the memory cell array is acceptable is set based on a sense amplifier enable signal, the sense amplifier enable signal is output from a sense amplifier control circuit which is controlled by the first control circuit.

* * * * *